(12) United States Patent
Wang

(10) Patent No.: US 6,936,851 B2
(45) Date of Patent: Aug. 30, 2005

(54) SEMICONDUCTOR LIGHT-EMITTING DEVICE AND METHOD FOR MANUFACTURING THE SAME

(76) Inventor: Tien Yang Wang, 468 Lowell St., Lexington, MA (US) 02420

( * ) Notice: Subject to any disclaimer, the term of this patent is extended or adjusted under 35 U.S.C. 154(b) by 0 days.

(21) Appl. No.: 10/394,686

(22) Filed: Mar. 21, 2003

(65) Prior Publication Data

US 2004/0183078 A1 Sep. 23, 2004

(51) Int. Cl.[7] .............................................. H01L 33/00
(52) U.S. Cl. ........................ 257/79; 257/89; 257/94; 257/96; 257/97; 257/103; 438/46; 438/47; 372/45; 372/46
(58) Field of Search ............................. 257/79, 89, 94, 257/96, 97, 99, 103; 438/22, 24, 46, 47, 481, 483; 372/45–46; 374/45, 46

(56) References Cited

U.S. PATENT DOCUMENTS

| | | | |
|---|---|---|---|
| 4,561,916 A | 12/1985 | Akiyama et al. | |
| 4,578,142 A | 3/1986 | Corboy, Jr. et al. | |
| 6,051,849 A | 4/2000 | Davis et al. | |
| 6,177,688 B1 | 1/2001 | Linthicum et al. | |
| 6,452,216 B1 * | 9/2002 | Tsuda et al. | ............... 257/94 |

OTHER PUBLICATIONS

M.J. Weber, Handbook of laser science and technology, 1982, CRC Press, USA, p. 199.

S. Mahajan, Handbook on semiconductors, v.3A, 1992, Elsevier Science B. V., Netherlands, p. 394.

S.K. Ghandhi, VLSI fabrication principles: silicon and gallium arsenide, 1994, John Wiley & Sons, USA, p. 269.

G.P. Agrawal and N.K. Dutta, Semiconductor lasers, 1993, Van Nostrand Reinhold, NY, USA, p. 163.

G.B. Stringfellow and M.G. Craford, High brightness light emitting diodes, 1997, Academic Press, San Diego, USA, p. 30.

H.S. Nalwa, Handbook of advance electronic and photonic materials and devices, 2001, Academic Press, San Diego, USA, v.1, p. 88.

M. Grayson, Encyclopedia of semiconductor technology, 1983, John Wiley & Sons, USA, p. 429.

(Continued)

Primary Examiner—Donghee Kang

(57) ABSTRACT

Semiconductor light emitting device and methods for its manufacture comprises a plurality of textured district defined on the surface of the substrate. The initial inclined layer deposition serves to guide the extended defects to designated gettering centers in the trench region where the defects combine with each other. As a result, the defect density in the upper section of the structure is much reduced. By incorporating a blocking mask in the structure, the free propagation of extended defects into the active layer is further restricted. The present invention is useful in the fabrication of semiconductor light emitting devices in misfit systems.

14 Claims, 7 Drawing Sheets

OTHER PUBLICATIONS

S. Barnet et al, Dictionary of physics, 2004, Spektrum Akadomischer Verlag, German, V2. p. 1095; V3, p. 1313.

B.D. Joyce et al., "Selective epitaxial deposition of silicon", Nature, vol. 195 (1962) pp. 485–486.

F.W. Tausch, Jr. et al., "A novel crystal growth phenomenon: single crystal GaAs overgrowth onto silicon dioxide", J. Electrochem. Soc. vol. 12 (1965) pp. 706–709.

L. Jastrzebski et al., "Growth process of silicon over $SiO_2$ by CVD: epitaxial laterial overgrowth technique", J. Electrochem. Soc. vol. 130 (1983) pp. 1571–1580.

Y. Ujiie et al., "Epitaxial lateral overgrowth of GaAs on a Si substrate", Jpn. J. Appl. Phys. vol. 28(3) (1989) pp. L337–L339.

A. Usui et al., "Thick GaN epitaxial growth with low dislocation density by hydride vapor phase epitaxy (HVPE)", Jpn. J. Appl. Phys. vol. 36 (1997) pp. L899–L902.

S. Kinoshita et al., "ELO of Si on non–planar substrate", J. Crystal Growth, vol. 115 (1991) pp. 561–566.

D.W. Shaw, "Morphology analysis in localized crystal growth and dissolution", Journal of Crystal Growth, vol. 47 (1979) pp. 509–517.

D.W. Shaw, "Influence of substrate orientation on GaAs epitaxial growth rates", Second International GaAs Symposium (1968) pp. 50–54.

E. Bassous et al., "The fabrication of high precision nozzles by the anisotropic etching of (100) silicon", J. Electrochem. Soc. vol. 125 (1978) pp. 1321–1327.

Y–K Song et al., "A Vertical Cavity Light Emitting InGaN Quantum Well Heterostructure", Appl. Phys. Lett. vol. 74, No. 23 (1999) pp. 3441–3443.

\* cited by examiner

SEMICONDUCTOR LIGHT-EMITTING DEVICE AND METHOD FOR MANUFACTURING THE SAME

BACKGROUND OF THE INVENTION

1. Field of Invention

The present invention relates generally to the fabrication of semiconductor devices such as light-emitting devices in misfit systems. In particular, the lattice defects are guided to and contained in designated locations defined by textured districts on the substrate surface. As a result, the free propagation of extended defects through the active region is restricted and the overall defect density of the system is reduced.

2. Description of Prior Art

Lattice-mismatched system such as GaAs/Si is promising to obtain large-area wafers for optoelectronic device applications. However, the quality of the directly disposed layer is inferior due to the penetration of threading dislocations in this material system. M. Akiyama et al demonstrated GaAs layer on Si substrate the using a low-temperature buffer layer and a superlattice intermediate layer in U.S. Pat. No. 4,561,916.

Seeded overgrowth has also been used as an alternative to obtain single crystalline epilayers deposited over the surface of an amorphous mask layer. In the context of epitaxial lateral overgrowth (ELO), the seed layer extends through the apertures and spreads over the mask surface. The building block of the prior art ELO method is the selective epitaxial growth (SEG) where no nucleation takes place on the mask surface. B. D. Joyce et al reported SEG of Si epilayer over the oxide mask using chemical vapor deposition (CVD) in Nature, Vol. 195 (1962) pp. 485–486. F. W. Tausch, Jr. et al demonstrated GaAs on $SiO_2$ mask using ELO in J. Electrochem. Soc. Vol. 12 (1965) pp. 706–709. The ELO method has been used to fabricate silicon-over-insulator (SOI) using CVD as described by L. Jastrzebski et al in J. Electrochem. Soc. Vol. 130 (1983) pp. 1571–1580 and by J. F. Corboy, Jr. et al in U.S. Pat. No. 4,578,142.

The ELO method has also been used to deposit GaAs epilayers on Si substrate by Y. Ujiie et al in Jpn. J. Appl. Phys. Vol. 28(3) (1989) pp. L337–L339. Thus a GaAs layer is first grown on the Si(11) substrate using molecular beam epitaxy. A $SiO_2$ mask is formed on the GaAs surface by photolithography and the GaAs layer is deposited using liquid phase epitaxy. The defect density is reduced in the overgrown layer where the threading dislocations are blocked by the mask layer. Similarly, A. Usui et al described the ELO growth of GaN on sapphire using hydride vapor phase epitaxy (HVPE) in Jpn. J. Appl. Phys. Vol. 36 (1997) pp. L899–L902. R. F. Davis et al described the ELO growth of GaN layer on SiC substrate in U.S. Pat. No. 6,051,849. The influence of the substrate can be further reduced by making the ELO layer suspended above the substrate as described by S. Kinoshita et al in J. Crystal Growth, Vol. 115 (1991) pp. 561–566 and by K. J. linthicum et al in U.S. Pat. No. 6,177,688.

The prior art methods have following drawbacks. The layer growth from the mask openings allows for the free propagation of dislocations into the active layer. As a result, multiple ELO steps are required for defect reduction causing long cycle time and poor process yield. This restraint can be relaxed somewhat by depositing the layers over etched surface features with a specific inclination angle. However, the layer disposition over prescribed surface feature is highly sensitive to the etching defects. The etching defects expose random nucleation sites causing adverse microfaceting and layer deterioration. Thus structural defects are inevitably generated as the growth front attempts to negotiate surface defects with sharp corners and abrupt changing curvature. The grown-in defects will multiply and propagate into the active region during operation causing premature degradation of the device. These drawbacks offset the benefits of using the ELO method for defect reduction.

BRIEF SUMMARY OF THE INVENTION

The aforementioned deficiencies are addressed, and an advance is made in the art, by using the substrate member comprising a textured surface district described in the present invention. The controlled layer deposition over the textured surface district proceeds such that the inclined layer growth in the trench region diminishes in the early stage of the process. Since the threading dislocations propagate along the growth direction, they are guided towards designated location and confined therein. The free propagation of the dislocation defects is thus restricted and the defect density in the active layer is significantly reduced. The textured district in the present invention comprises a plurality of smooth trenches without a prescribed angle of inclination. This allows for the nucleation of smooth semiconductor layers over the energetically favorable sites.

In the present invention, the substrate is patterned using conventional lithographic methods, followed by thermal anneal to smooth out sharp corners and etching defects. After thermal etching and solid-state diffusion, the stripe or mesa features become naturally rounded and free of surface irregularities. The textured surface district thus obtained is essential for the growth of smooth layers without the occurrence of chaotic micro-faceting.

The defect density is further reduced by using the mask to block the defect propagation. In this case, the mask district is spaced by a plurality of smooth trenches and the layer is allowed to dispose around the ledge of the mask. As a result, the free propagation of threading dislocations is further restricted by the mask district. The semiconductor member in the present invention is suitable for the low-cost, large area fabrication of misfit device structures.

Furthermore, the layer deposition around the mask district is altered by varying the aspect ratio of the mask. Due to the excessive supply of adatoms migrating from the mask surface, the thickness and alloy composition of the layer is modulated. As a result, the individual emitter disposed over the present mask district emits at a different wavelength of the spectrum. The chirped mask design in the present invention is useful to digitally synthesize the desirable color output of the light-emitting device by tailoring the light emission from its component emitters.

The present invention will be best described in detail with reference to the figures listed and is described below.

DETAILED DESCRIPTION OF THE INVENTION

Figure 1A:
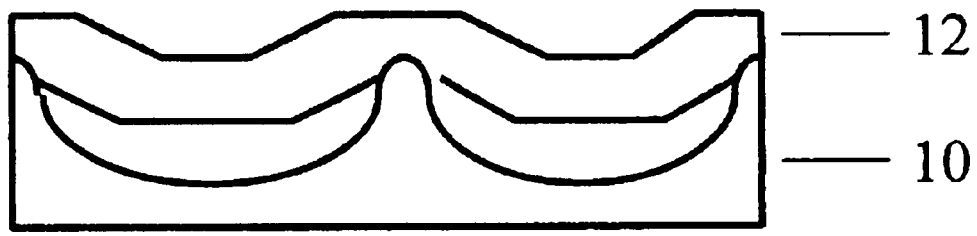
FIG. 1A is a cross-sectional view showing early layer deposition over the textured surface district in accordance with the embodiment of the present invention.

The semiconductor device in the present invention is fabricated on a substrate having a textured district defined on the substrate surface. The textured surface district comprises a plurality of etched features such as trenches and mesa having a smooth rotation of micro-facets. Accordingly, the direction of inclined layer growth is not uniquely prescribed by mesa etching. Instead, a spectrum of micro-facets is exposed to allow preferential layer nucleation over facets with energetically favorable sites. The epilayer deposition is solely determined by the growth chemistry and is less prone to the etching defects. As the inclined growth proceeds, the extended defects such as misfit dislocation are guided to designated locations and the overall defect density in the misfit system is reduced.

In accordance with an illustrative embodiment of the present invention, mesa or stripe features are first defined over the surface of the substrate using conventional photolithography etching methods. Alternatively, the surface feature is defined on the surface of a buffer layer predisposed on the substrate. Exemplary substrates include GaAs, InP, spinel, sapphire, GaN, GaN-on-sapphire, GaAs, Si, Si-on-insulator, SiC, SiC-on-Si. For example, stripes along the [011] or the [01$\bar{1}$] direction are defined on the (100)GaAs surface using a resist mask or nitride mask following by wet etching in an isotropic etchant such as $H_2SO_4:H_2O_2:H_2O$ (10:1:1 by volume). In this case, the etching is diffusion limited resulting in a curved etching profile. Alternatively, the substrate is dipped in an anisotropic etchant such as $H_2SO_4:H_2O_2:H_2O$, $H_3PO_4:H_2O_2:H_2O$ and $NH_4OH:H_2O_2:H_2O$. Due to the presence of the slow etching (111)Ga face, reverse mesa structure or trapezoidal trenches are formed for ridges aligned in the [011] and the [01$\bar{1}$] direction, respectively. The detailed etching profile has been described by D. W. Shaw in Journal of Crystal Growth, Vol. 47 (1979) pp. 509–517. The nitride mask is then removed using plasma etching in $CF_4$ after the surface trenches are formed. The etched surface thus obtained contains sharp corners and etching defects that may cause excessive layer distortion during the layer deposition.

In accordance with an illustrative embodiment of the present invention, the substrate is further etched after stripping off the etch mask to reduce surface trenches and mesa to desirable shapes. For example, the patterned GaAs substrate is solvent cleaned and dipped in HCl to remove surface oxide, followed by isotropic etching in $H_2SO_4:H_2O_2:H_2O$ (10:1:1 by volume) or $Br_3/CH_3OH$ to produce a sloped etching profile comprising a smooth rotation of micro-facets. The surface features in the present invention can be defined on the surface of various substrates using wet etching, dry etching and photoelectrochemical etching. For example, windows along [110] or [1$\bar{1}$0] are opened in $Si_3N_4$ mask on the surface of Si substrate. After dipping in an anisotropic etchant such as KOH; isopropyl alcohol solution, V-shape grooves with (111) sidewalls are obtained due to the presence of the slow etching (111) plane. Alternatively, the masked substrate is directly dipped in an isotropic etchant to produce trenches with a curved etching profile. After stripping off the mask, the patterned substrate is further isotropically etched in $HNO_3:CH_3COOH:HF$.

In accordance with an illustrative embodiment of the present invention, the substrate is further thermally annealed to polish off sharp corners and etching defects. After dipping in $H_2SO_4/H_2O_2/H_2O$ and HCl to desorb the surface oxide, the substrate is loaded into the growth chamber and heated to the anneal temperature. Exemplary process conditions are 820° C. for 30 minutes in an arsine ambient for GaAs substrate to preserve surface quality. This effectively converts the sharp corners into a sloped profile comprising a smooth rotation of micro-facets. The smooth surface feature in the present invention is essential for the deposition of low defect density structures suitable for device applications.

The preferred method for the layer deposition on the patterned substrate in the present invention includes metalorganic vapor phase epitaxy (MOVPE) and hydride vapor phase epitaxy (HVPE). Typical source nutrients in MOVPE include trimethyl compounds such as TMGa, TMIn, TMAl for group III elements, and group V hydrides such as $NH_3$, $PH_3$ and $AsH_3$ for the group V elements. Disilane, $H_2Se$ and $(Me)_2Zn$, $Cp_2Mg$ are used as the n- and p-type dopants, respectively.

Figure 1B:
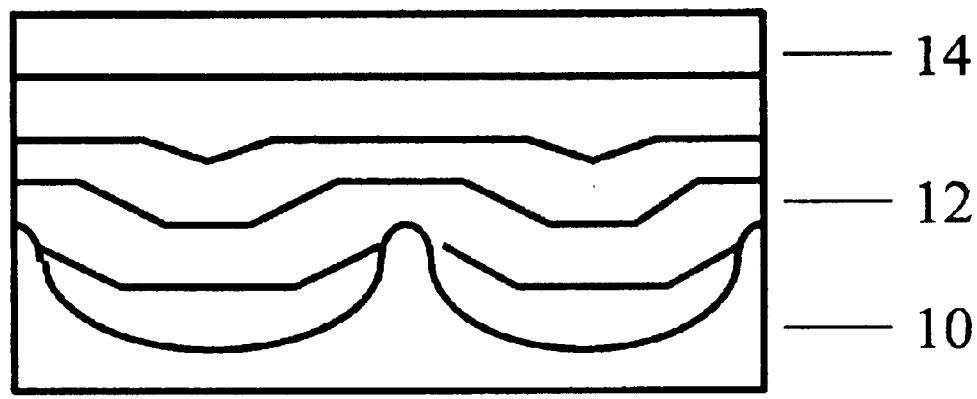
FIG. 1B shows the diminishing inclined layer growth.
Figure 1C:
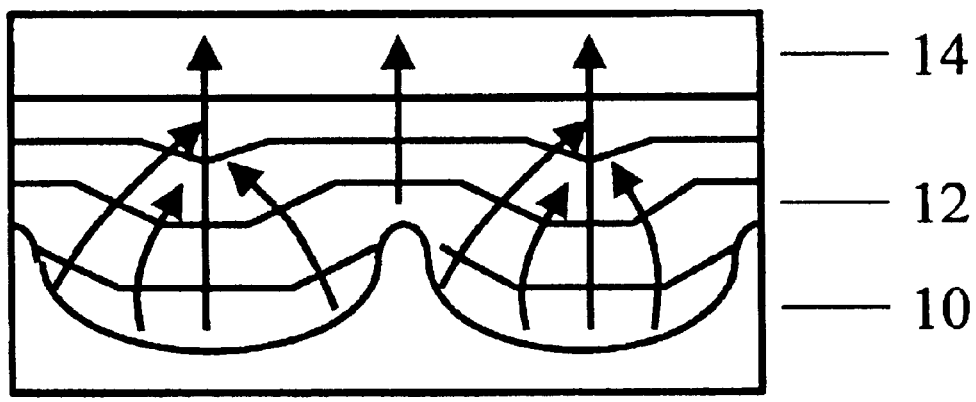
FIG. 1C shows the direction of defect propagation in the structure.

FIG. 1A is a cross-sectional view showing initial layer deposition over the textured substrate surface in accordance with the embodiment of the present invention. The layer deposition proceeds in a manner such that the inclined layers 12 emerging from the adjacent slopes meet and combine in the trench region. As the growth proceeds, the inclined growth diminishes and the upper section 14 of the structure becomes planar as shown in FIG. 1B. Thus the inclined layers are confined and embedded in the early stage of the deposition. Since the dislocation propagates along with the advance of the growth front, it is also inclined away from propagating upwards. The dislocation defects are guided towards the center of the trench where the counter approaching dislocations confront each other and combine as illustrated in FIG. 1C.

In contrast to the prior art methods, there is no prescribed plane for the layer to grow. The layer has an equal opportunity to grow on all of the exposed facets. During the course of deposition, the surface adatoms migrate over growing surface and preferentially incorporate into facets of energetically favorable sites. Thus the precession of layer deposition does not necessary register the contour of the starting substrate. Instead, the growth behavior is uniquely determined by the growth ambient such as substrate temperature, V/III ratio, growth rate, reactor pressure, and carrier gas composition. The orientation-dependent layer deposition has been described by D. W. Shaw in GaAs symp. (1968) pp. 50–54. By incorporating the present textured surface district, the inclined layer growth is further optimized such that the extended defects are deliberately routed to designated gettering centers in the trench region. As a result, the overall defect density in the misfit system is much reduced.

Figure 2A:
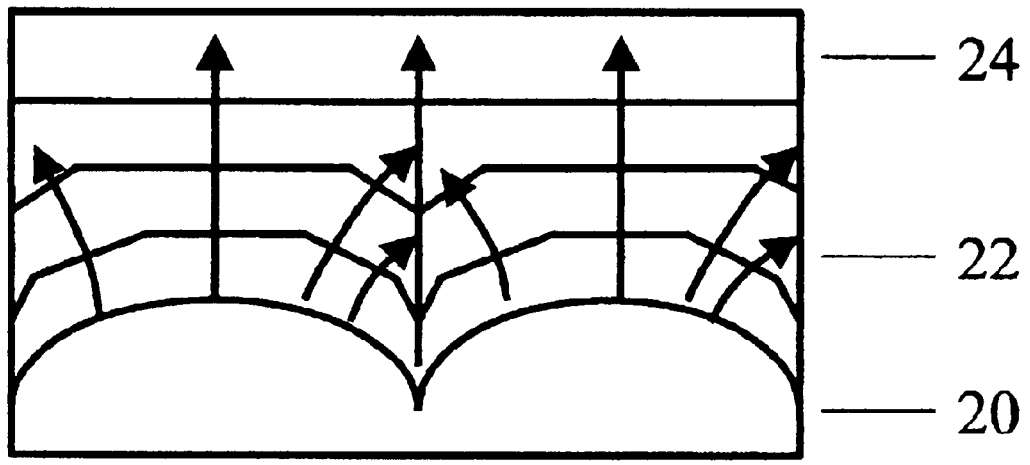
FIG. 2A and FIG. 2B are cross-sectional views showing layer deposition and defect propagation over the textured surface district in accordance with another embodiment of the present invention.
Figure 2B:
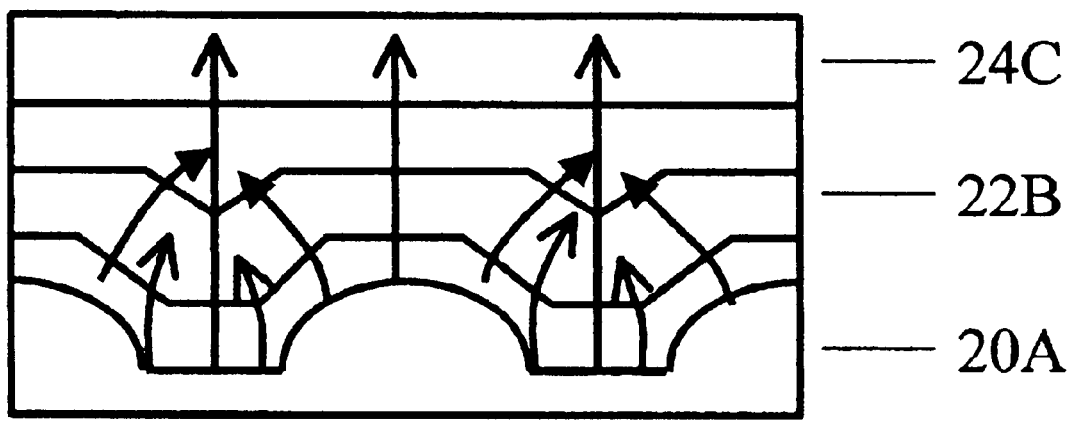

FIG. 2A is a cross-sectional view showing layer deposition and defect propagation using the textured district in accordance with another embodiment of the present invention. As the growth proceeds, the transient nonplanar growth 22 becomes planar 24 as the inclined layer merges with its counter part. The results are similar when the trenches are spaced by a base feature as illustrated in FIG. 2B where the arrows indicates the direction of defect propagation. The defect level is much reduced after the counter propagating threading dislocations combine in the trench region.

The emerging planar surface is suitable for the deposition of semiconductor device structures. Direct penetration of misfit dislocations is only possible from the open ridge and from the trench center where the traveling dislocations combine. Thus the present trench array acts as a chain of local defect gettering centers. Furthermore, the misfit stress and thermal stress of the system is distributed across the trench array in the present invention. As a result, the overall interfacial stress is lower and the bending of the epiwafer is reduced. The present invention is suitable for the fabrication of high quality device structures on large area, low-cost substrates. Due to the lack of insulating mask, the present device is advantageous for low voltage operations with a vertical or lateral current injection scheme.

In accordance with another embodiment of the present invention, the misfit defects from the open ridge are further reduced by the etch mask. Specifically, the layer is allowed to deposit around the ledge of the mask overhang. In this case, the mask is retained as part of the device structure. For example, a nitride mask is formed on the surface of the substrate followed by anisotropic etching. Due to the presence of the slow etching (111)Ga face, reverse mesa or trapezoidal trenches are formed for ridges aligned in the [011] and the [01$\bar{1}$] direction, respectively. Examples of the dielectric etch mask include $SiO_2$, $Si_3N_4$ and their combinations. In this case, the extent of mask undercut U is expressed by $U=R_{(111)}t/\sin \theta$ where $R_{(111)}$ is the etch rate of the (111) planes and t is the etching time. The angle $\theta$ between the {111} planes and the (100) surface is ~55°. Examples of the anisotropic etching of Si using an aqueous solution containing pyrocatechol and ethylene diamine has been described by E. Bassous et al in J. Electrochem. Soc. Vol. 125 (1978) pp. 1321–1327. The wafer is then subjected to isotropic etching to render a smooth etching profile suitable for layer deposition.

Figure 3A:
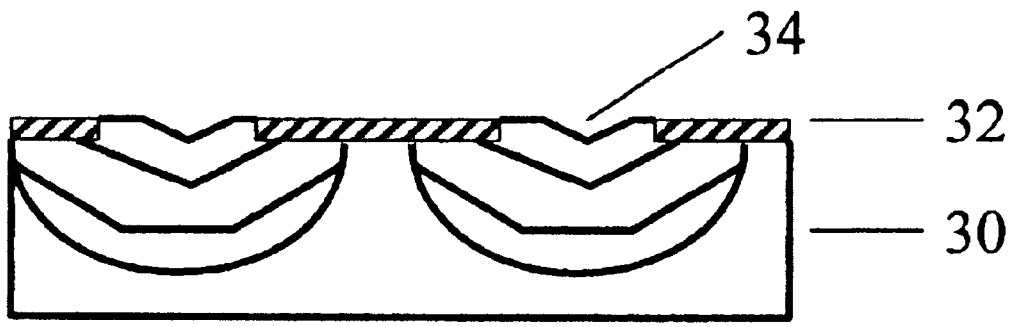
FIG. 3A is a cross-sectional view showing transient layer deposition around the ledge of the mask district in accordance with another embodiment of the present invention.
Figure 3B:
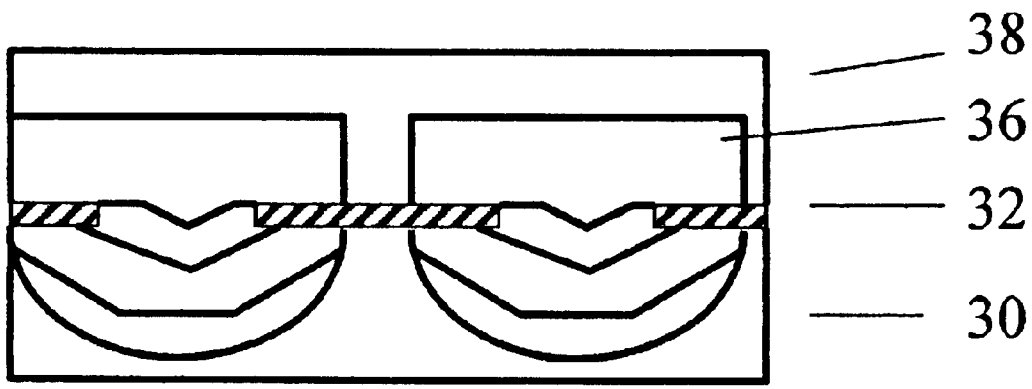
FIG. 3B shows the merger of layers grown above the mask.
Figure 3C:
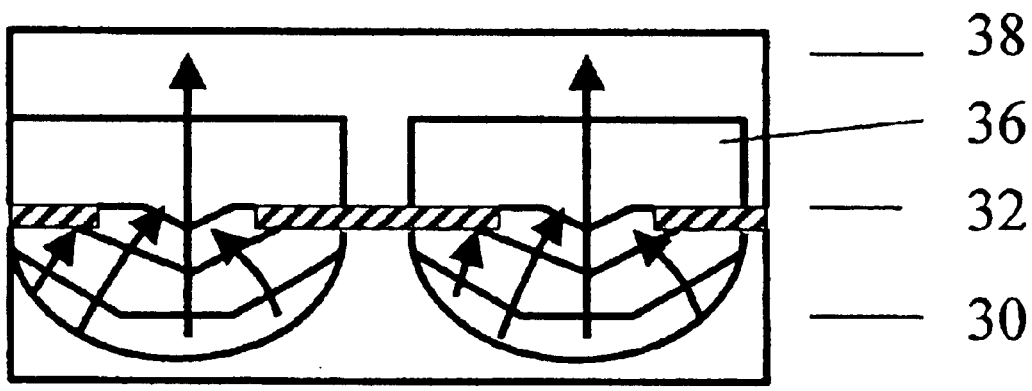
FIG. 3C shows the direction of defect propagation in the structure.

The geometry of the mask district in the present invention facilitates the inclined layer growth inside the trench region as shown in FIG. 3A. As the growth proceeds, the inclined growth 34 becomes planar 38 as shown in FIG. 3B. The defects extended from the undercut region are blocked by the ledge of the mask district as depicted in FIG. 3C. As a result, the free propagation of threading dislocations from the open ridge is prohibited. The defects outside of the undercut region are guided to the trench region as described above.

Figure 4A:
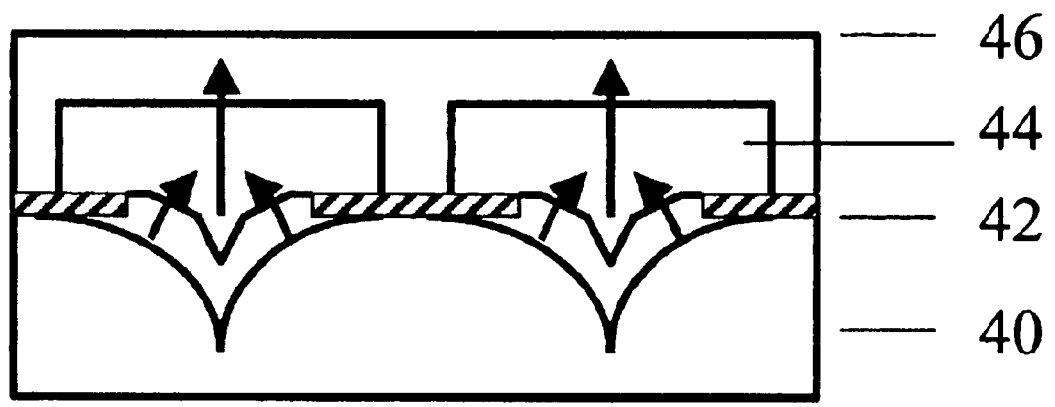
FIG. 4A and FIG. 4B is a cross-sectional view showing layer deposition and defect propagation around the ledge of the mask district in accordance with another embodiment of the present invention.
Figure 4B:
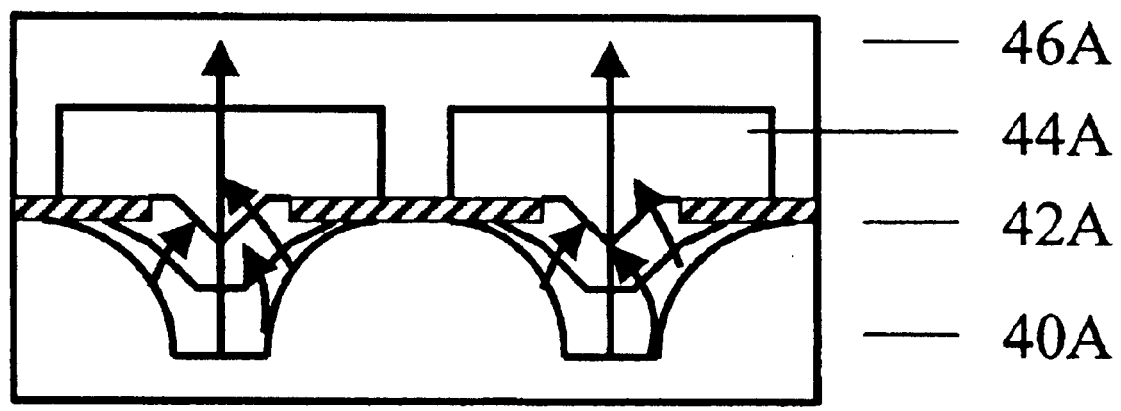

FIG. 4A is a cross-sectional view showing layer deposition and defect propagation using the mask district in accordance with another embodiment of the present invention. In this case, trenches are first formed by etching of the substrate 40 through openings defined in the mask district 42. As the deposition proceeds, planar layers 44 develop at the expense of the inclined layer growth in the trench. The layers emerging from the trenches confront and combine at the center of the mask. Further growth leads to layer planarization 46 of the upper section of the structure. The mask district 42 is embedded in the structure and retains a part of the device. The results are similar when the trenches are spaced by a base feature as illustrated in FIG. 4B where the arrows indicate the direction of defect propagation. The defect level in the upper section 46 and 46A is much reduced as the counter propagating threading dislocations combine in the trench region. The structure of the present semiconductor member is advantageous since only the threading dislocation from the center of the trench may find its way to reach the active layer.

The present mask design is not restricted by the extent of the mask overhang. Changing the window-to-mask ratio affects the layer deposition rate and alloy composition in the trench region while the growth habit remains unaltered. In the extreme case of excessive mask overhang, voids may be left behind owing to the restricted supply of nutrients reaching the corner of the undercut. In the extreme case of excessive trench width, inclined growth is less effective in preventing the extended defect from reaching the active region. A thicker layer is required to contain the defects causing bow and warp of the wafer. It is another objective of the present invention to alleviate the constraint of trench width by dividing the wide trench into a plurality of spaced narrow trenches.

In accordance with another embodiment of the present invention, the mask district further provides desirable functionality to the device. For light-emitting devices, the mask district may contain a plurality of reflective mirrors spaced by etched trenches. After deposition, the reflective mask is embedded at the substrate interface. Thus the downward emitted light is reflected back and redirected to the top surface for exit. As a result, the substrate absorption loss of light emission is reduced and the extraction efficiency of the device is enhanced. The reflective mask district in the present invention allows for the use of substrate that is either transparent or absorbing at the wavelength of the light emission. Examples of dielectric mirror masks include $Si/SiO_2$, $SiO_2TiO_2$ in the infrared, $SiO_2/ZrO_2$ in the visible, $HfO_2/SiO_2$ in the blue and UV region of the spectrum, respectively. Conventional e-beam evaporation and reactive ion beam sputtering methods are employed to dispose the mirror stacks. Examples of reflective metal masks include transitional metal elements such as W, Ta, Ti, Pt, Pd, Ni, Au, Cr, Ag, Cu. The mask districts are fabricated by conventional photolithographic methods followed by wet etching or plasma etching of the substrate. Conventional etchants for the dielectric masks include HF, BHF, $H_3PO_4$, $H_2SO_4$, NaOH(~30%). The fabrication of the dielectric mirror masks has been described by Y-K Song et al in Appl. Phys. Lett. Vol. 74, No. 23 (1999) pg. 3441–3443. The selection of the metal mask is solely based on its thermal and chemical stability in the growth ambient and the low absorption loss at the emission wavelength of the device. Both types of the mirror masks have a high reflectivity and a broad bandwidth. The dielectric mirror mask has a high index ratio suitable for the design of highly reflective mirrors using a minimum number of quarterwave pairs. The metal mask has a high thermal conductivity suitable for heat dissipation and continuous operation of the device. The low resitivity of the metal mask further allows for low voltage operation of the device.

Figure 5A:
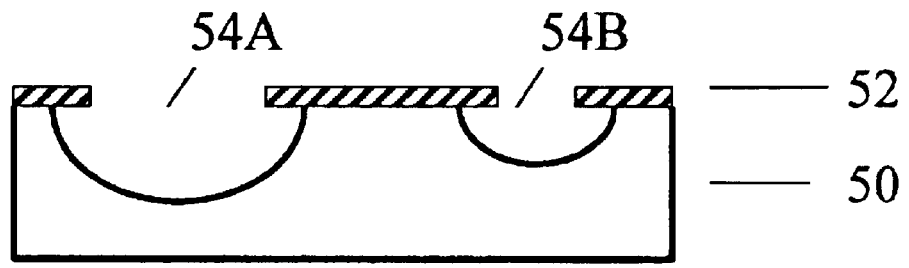
FIG. 5A is a cross-sectional view showing of the chirped mask district in accordance with another embodiment of the present invention.
Figure 5B:
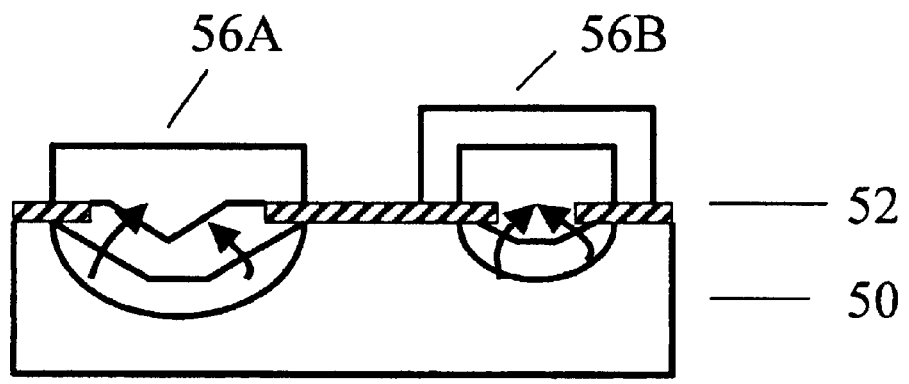
FIG. 5B shows the layer deposition and defect propagation in the structure.

In accordance with another embodiment of the present invention, the mask district further comprises chirped trenches with modulated window-to-mask ratio. As illustrated in FIG. 5A, mask district 52 with variable openings is photolithographically defined on the surface of the substrate 50, followed by substrate etching to form isotropic trenches 54A and 54B with mask undercut. After dipping in acids to remove surface oxide, the substrate is loaded into the growth chamber and heated to the growth temperature. During the growth, the surface adatoms migrate across the mask surface before lodging into facets of energetically favorable site. The incorporation efficiency depends on the distribution of the surface adatoms across the structured surface. As shown in FIG. 5B, the alloy composition and thickness is different in local layer depositions 56A and 56B in the chirped trench array. This effect is more profound for layer deposition in narrow mask opening due to the abundance of adatom supply from the non-sticking dielectric mask.

Figure 5C:
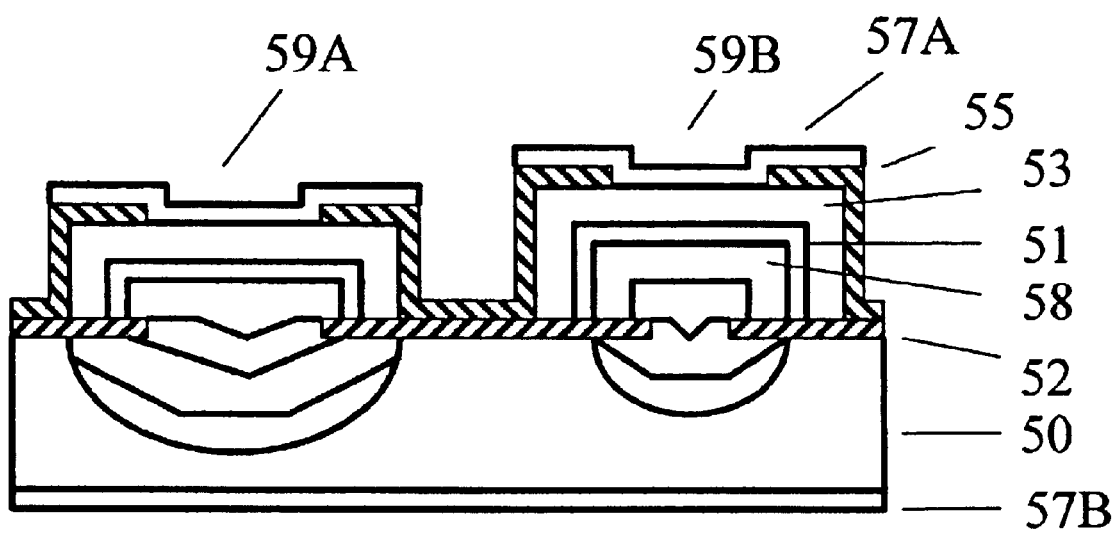
FIG. 5C illustrates the structure of light emitters fabricated over the chirped mask district.

The chirped mask district in the present invention provides another degree of freedom in the fabrication of devices with desirable properties. As illustrated in FIG. 5C, a light-emitting device is disposed on the surface of the chirped mask array 52 comprising a buffer layer, a lower cladding layer 58, an active layer 51, an upper cladding layer 53, and a contact layer. Lateral injection schemes are then deployed for insulating substrate such as sapphire while vertical injection schemes are deployed for conductive substrates such as GaAs, SiC and Si. The mask district also provides the isolation between the individual emitters. The path of current flow is confined by the openings in the $SiO_2$ film 55 and mask district 52 after forming front contact metal 57A and back metal 57B. Since the rest area is not pumped, the heat dissipation is reduced leading to reliable operation of the device. It also minimizes the influence of edge distortion of the layer disposed under non-optimized conditions. As a result, the uniformity of light emission of the device is improved. The individual emitters 59A and 59B emit at a different wavelength of the spectrum uniquely determined by the thickness and composition of the active layer. The hybridization of the light emission from the component emitters determines the light output of the device. The weight of color components can be readily modulated by adjusting the number of emitters in each group. Thus by proper design of the mask layout, the color and the brightness of individual emitter can be tailored to achieve the desirable color gamut of the light output of the device. Moreover, the hybrid emitter design in the present invention has a high quantum efficiency and thus more energy-efficient than the conventional phosphor-based lighting devices.

Figure 6A:
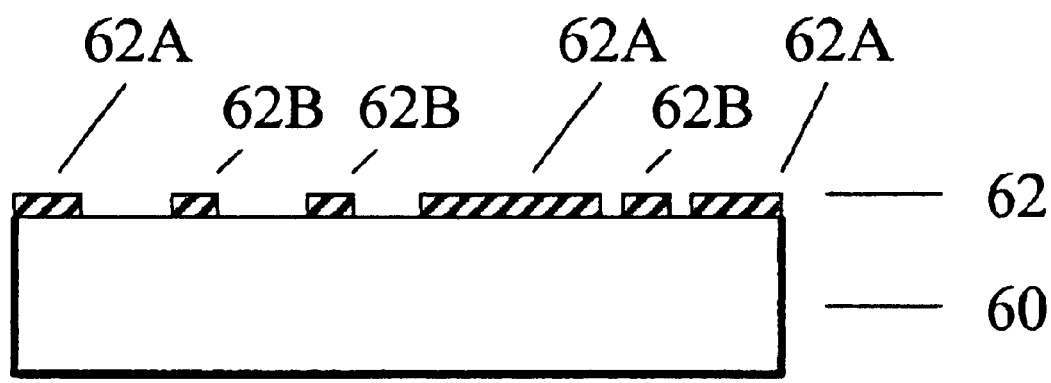
FIG. 6A shows the mask district comprising blocking mask and divider masks in accordance with another embodiment of the present invention.
Figure 6B:
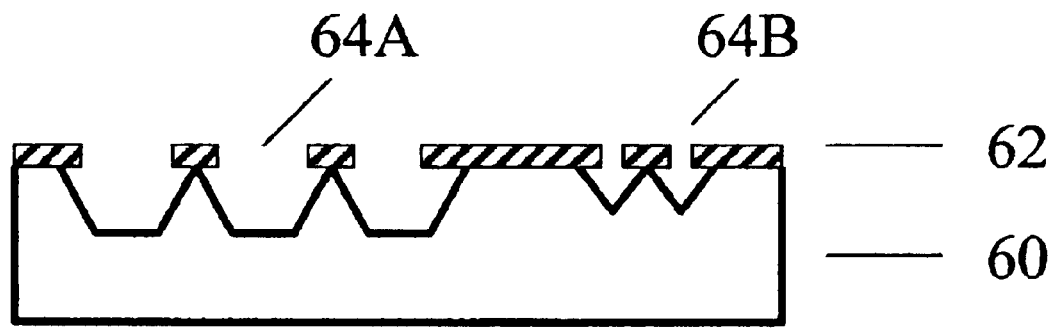
FIG. 6B shows crystallographic etching profile of the structure.
Figure 6C:
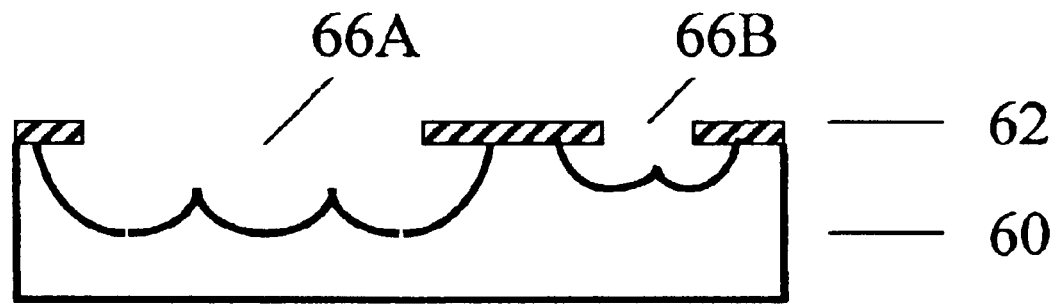
FIG. 6C shows formation of the trench array inside the window after isotropic etching.

In accordance with another embodiment of the present invention, the constraint of window size is alleviated by dividing the wide window into a plurality of narrow trenches. The initial layer deposition comprises a series of inclined portions within the window. Instead of freely propagating upwards, the extended defects are routed to the bottom of the window region where they are contained. As a result, the defects are distributed across the local gettering centers prescribed inside the window and the defect density of the device is reduced. The fabrication process is illustrated in FIG. 6A–6C. The mask district 62 is defined on the substrate surface using conventional photolithographic methods, comprising blocking mask 62A and divider mask 62B spaced within the etch mask. After anisotropic etching, spaced trenches 64A and 64B are formed undercutting the etch masks 62. The substrate 60 is then subjected to isotropic etching to achieve the desirable etching profile. Further etching triggers the liftoff of the narrow divider mask as it becomes unsupported, leaving behind an array of narrow trenches 66A and 66B in the window. The layer deposition and defect reduction in the window region follows that depicted in FIG. 1. Thus the constraint of window size is alleviated using the present divider mask design. The use of subdivided window in the present invention is advantageous since a thinner layer is needed for defect confinement. The diffused metallurgical interface between the layer and substrate further contributes to a lower stress level in the wafer. Thus the wafer bow and warp is reduced leading to a high process yield of the present device.

Figure 7A:
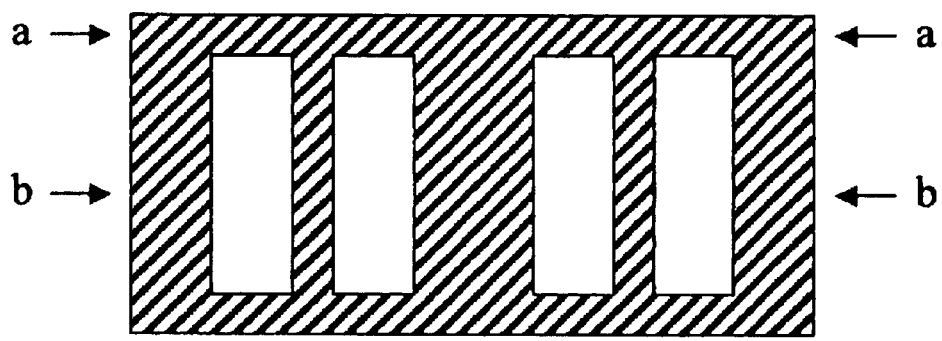
FIG. 7A shows the layout of the mask district comprising blocking mask and bridge masks in accordance with another embodiment of the present invention.
Figure 7B:
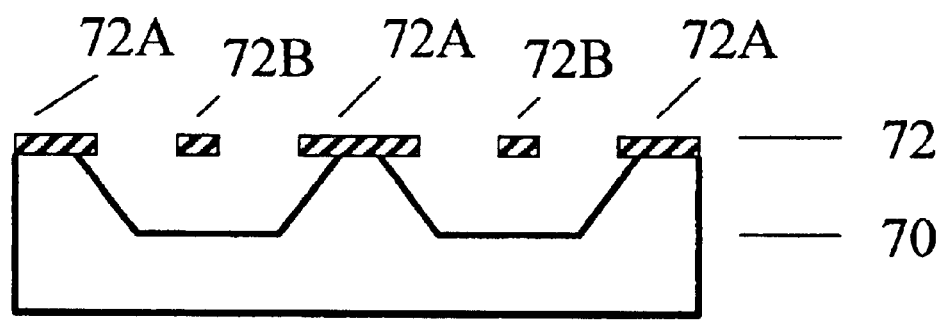
FIG. 7B is a cross-sectional view showing the bridge masks hanging over the center of the trench.
Figure 7C:
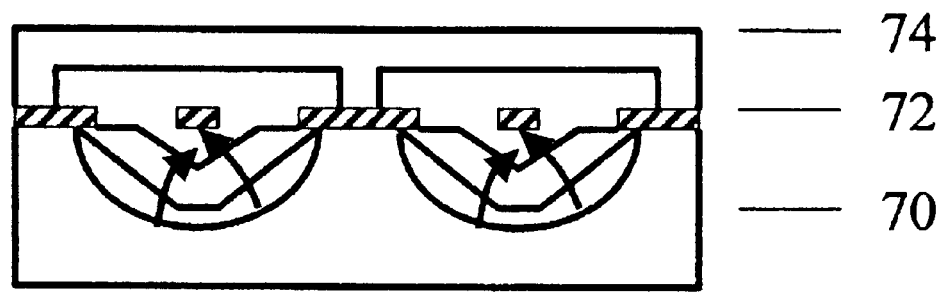
FIG. 7C shows transient layer deposition the direction of defect propagation in the structure.

In accordance with another embodiment of the present invention, the defect propagation in the trench region is restricted by using mask districts further comprising a plurality of bridge masks. In this case, the bridge mask is hanging over the trench region and is retained as part of the finished structure. FIG. 7A shows a planar view of the layout of the mask district. The mask districts are mechanically supported by spaced posts aa which is aligned with the sawing street. FIG. 7B is a cross sectional view of the mask district 72 along bb showing the blocking mask 72A and bridge mask 72B. Due to its narrower width, the bridge masks 72B become suspended during anisotropic etching. The etching is complete after undercutting the blocking mask 72A. The substrate 70 is further isotropically etched to obtain a smooth etching profile. FIG. 7C shows the gettering of the extended defects in the layer disposed around the suspension bridge. In this case, the planar layer growth in the center of the trench is suppressed while the inclined growth is enhanced. As a result, the defect gettering is more efficient as the escaping defects are blocked by the bridge mask array. Further deposition leads to planarization of the layer 74 with a low defect density suitable for the fabrication of semiconductor devices such as light-emitting devices in the misfit systems.

I claim:
1. A semiconductor light-emitting device comprising:
   a substrate;
   a textured district defined on the surface, of said substrate comprising a plurality of etched trenches having a sloped etching profile with a smooth rotation of microfacets without a prescribed angle of inclination;
   a first layer disposed on said textured district; comprising a plurality of inclined lower portions so as to guide the extended lattice defects away from propagating into the active layer, said first layer and said substrate form a lattice-mismatched misfit system, said substrate is selected from the group comprising group III-V, group IV, group II-VI elements and alloys, ZnO, spinel and sapphire; and
   a light-emitting structure containing an active layer disposed on said first layer.
2. The device or claim 1, wherein said first layer has an upper planar portion with slow defect density.
3. The device of claim 1, wherein said textured district is formed on a buffer layer disposed on said substrate.
4. The device of claim 1, wherein said textured district comprises a plurality of chirped trench array.
5. A semiconductor light-emitting device comprising:
   a substrate;
   a textured district defined on the surface of said substrate comprising a plurality of mask districts spaced by etched trenches having a sloped etching profile with a smooth rotation of micro-face without a prescribed angle of inclination;
   a first layer disposed on said textured district; comprising a plurality of inclined lower portions so as to guide the extended lattice defects away from propagating into the active layer, said first layer and said substrate form a lattice-mismatched misfit system, said substrate is selected from the group comprising group III-V, group IV, group II-VI element, and alloys, ZnO, spinel and sapphire; and a light-emitting structure containing an active layer disposed on said first layer.

6. The device of claim 5, wherein said mask district comprises a plurality of edge undercut portions such that the propagation of extended defects from said undercut portions is blocked by the ledge of said mask district.

7. The device of claim 5, wherein said mask district further provides isolation for independent operation of the individual light emitters disposed on said mask district.

8. The device of claim 7, wherein said individual light emitters emit at a different wavelength.

9. The device of claim 8, wherein the light output of the device relies on color mixing of the component light emission from said individual light emitters.

10. The device of claim 5, wherein said mask district further comprises a plurality of reflective mirror stack.

11. The device of claim 10, wherein said reflective mirror stack is selected from the group comprising metal and dielectric quarter-wave plates.

12. The device of claim 5, further comprising a bridge mask hanging over said etched trenches.

13. The device of claim 5, wherein said etched trenches are further subdivided into a plurality of narrow trenches.

14. The device of claim 5, wherein said mask district further comprises a chirped mask district having a modulated window-to-mask ratio.

* * * * *

UNITED STATES PATENT AND TRADEMARK OFFICE
CERTIFICATE OF CORRECTION

PATENT NO. : 6,936,851 B2
APPLICATION NO. : 10/394686
DATED : August 30, 2005
INVENTOR(S) : Tien Yang Wang It is certified that error appears in the above-identified patent and that said Letters Patent is hereby corrected as shown below:

Col. 6, line 44, replace "$SiO_2TiO_2$" with --$SiO_2/TiO_2$--.
Col. 8, line 38, delete the ","; line 53, replace "or" with --of--; line 54, replace "slow" with --a low--; line 64, replace "micro-face" by --micro-facets--.

Signed and Sealed this
Third Day of January, 2012

David J. Kappos
*Director of the United States Patent and Trademark Office*

(12) EX PARTE REEXAMINATION CERTIFICATE (10423rd)

United States Patent
Wang

(10) Number: US 6,936,851 C1
(45) Certificate Issued: Dec. 5, 2014

(54) SEMICONDUCTOR LIGHT-EMITTING DEVICE AND METHOD FOR MANUFACTURING THE SAME

(75) Inventor: Tien Yang Wang, Lexington, MA (US)

(73) Assignee: Lexington Luminance LLC, Lexington, MA (US)

Reexamination Request:
No. 90/012,964, Sep. 30, 2013

Reexamination Certificate for:
Patent No.: 6,936,851
Issued: Aug. 30, 2005
Appl. No.: 10/394,686
Filed: Mar. 21, 2003

Certificate of Correction issued Jan. 3, 2012

(51) Int. Cl.
*H01L 33/00* (2010.01)

(52) U.S. Cl.
USPC .......... 257/79; 257/89; 257/94; 257/96; 257/97; 257/103; 438/46; 438/47; 372/45; 372/46

(58) Field of Classification Search
USPC ........................ 257/79; 438/43, 44
See application file for complete search history.

(56) References Cited

To view the complete listing of prior art documents cited during the proceeding for Reexamination Control Number 90/012,964, please refer to the USPTO's public Patent Application Information Retrieval (PAIR) system under the Display References tab.

*Primary Examiner* — Tuan H Nguyen

(57) ABSTRACT

Semiconductor light emitting device and methods for its manufacture comprises a plurality of textured district defined on the surface of the substrate. The initial inclined layer deposition serves to guide the extended defects to designated gettering centers in the trench region where the defects combine with each other. As a result, the defect density in the upper section of the structure is much reduced. By incorporating a blocking mask in the structure, the free propagation of extended defects into the active layer is further restricted. The present invention is useful in the fabrication of semiconductor light emitting devices in misfit systems.

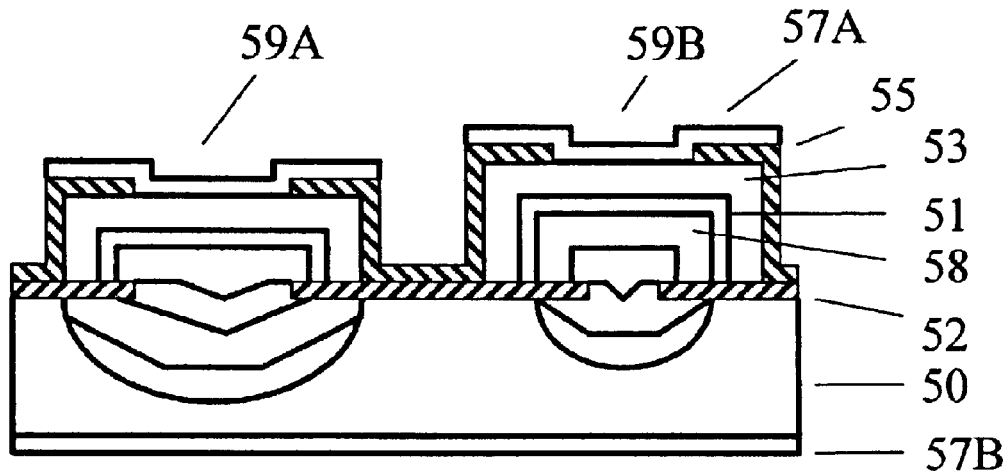

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 3 are determined to be patentable as amended.

Claims 2 and 4, dependent on an amended claim, are determined to be patentable.

New claims 15-18 are added and determined to be patentable.

Claims 5-14 were not reexamined.

1. A semiconductor light-emitting device comprising:
   a substrate;
   a textured district defined on the surface of said substrate comprising a plurality of etched trenches having a sloped etching profile with a smooth rotation of microfacets without a prescribed angle of inclination;
   a first layer disposed on said textured district[;], comprising a plurality of inclined lower portions [so as to guide the extended lattice defects away from propagating into the active layer], said first layer and said substrate form a lattice-mismatched misfit system, said substrate [is selected from the group comprising] *having at least one of a group consisting of* group III-V, group IV, group II-VI elements and alloys, ZnO, spinel and sapphire; and
   a light-emitting structure containing an active layer disposed on said first layer, *whereby said plurality of inclined lower portions are configured to guide extended lattice defects away from propagating into the active layer*.

3. [The device of claim 1, wherein said textured district if formed on a buffer layer disposed on said substrate] *A semiconductor light-emitting device comprising:*
   *a substrate;*
   *a buffer layer disposed on said substrate;*
   *a textured district defined on a surface of said buffer comprising a plurality of etched trenches having a sloped etching profile with a smooth rotation of microfacets without a prescribed angle of inclination;*
   *a first layer disposed on said textured district, comprising a plurality of inclined lower portions, said first layer and said substrate form a lattice-mismatched misfit system, said substrate having at least one of a group consisting of group III-V, group IV, group II-VI elements and alloys, ZnO, spinel and sapphire; and*
   *a light-emitting structure containing an active layer disposed on said first layer, whereby said plurality of inclined lower portions are configured to guide extended lattice defects away from propagating into the active layer.*

15. *A semiconductor light-emitting device comprising:*
    *a substrate;*
    *a textured district defined on the surface of said substrate comprising a plurality of etched trenches having a sloped smooth etching profile without sharp corners and without a prescribed angle of inclination;*
    *a first layer disposed on said textured district, comprising a plurality of inclined lower portions, said first layer and said substrate form a lattice-mismatched misfit system, said substrate having at least one of a group consisting of group III-V, group IV, group II-VI elements and alloys, ZnO, spinel and sapphire; and*
    *a light-emitting structure containing an active layer disposed on said first layer, whereby said plurality of inclined lower portions are configured to guide extended lattice defects away from propagating into the active layer.*

16. *The device of claim 15, wherein the sides of said etched trenches are smooth.*

17. *The device of claim 15, wherein the sides of said etched trenches are without sharp corners.*

18. *The device of claim 15, wherein the sides of said etched trenches are without a prescribed angle of inclination.*

* * * * *